United States Patent [19]

Siegl

[11] 3,999,127
[45] Dec. 21, 1976

[54] APPARATUS AND METHOD FOR AUTOMATICALLY TESTING THE GENERATOR AND REGULATOR OF A MOTOR VEHICLE

[75] Inventor: Erich Y. Siegl, Vienna, Austria

[73] Assignee: Sun Electric Corporation, Chicago, Ill.

[22] Filed: Nov. 20, 1974

[21] Appl. No.: 525,671

[30] Foreign Application Priority Data

Nov. 26, 1973 Austria ............................ 9915/73

[52] U.S. Cl. ........................... 324/158 R; 322/99; 324/158 MG
[51] Int. Cl.² ........................................ G01R 31/02
[58] Field of Search ............... 324/158 MG, 158 R; 322/99; 318/490

[56] References Cited

UNITED STATES PATENTS 2,841,768  7/1958  Robinson .................... 324/158 MG

FOREIGN PATENTS OR APPLICATIONS 1,258,512  1/1968  Germany .................... 324/158 MG Primary Examiner—Palmer C. Demeo
Assistant Examiner—Ernest F. Karlsen
Attorney, Agent, or Firm—Allegretti, Newitt, Witcoff & McAndrews

[57] ABSTRACT

An automatic generator and regulator tester and method thereof. With the apparatus and method described herein, various performance characteristics of the generator and regulator are determined for comparison, automatically and electronically, to known, standardized performance characteristics.

12 Claims, 5 Drawing Figures

APPARATUS AND METHOD FOR AUTOMATICALLY TESTING THE GENERATOR AND REGULATOR OF A MOTOR VEHICLE

BACKGROUND OF THE INVENTION

The present invention relates to a method of, and circuit arrangement for, in-shop testing of a generator-regulator unit of a motor vehicle.

In the production control of such units, it has been proposed to test the generator by an oscillographic indication of its capacity diagram and comparison thereof with control diagrams worked into templates. However, such testing cannot be used for in-shop testing of generators because individual shops must test generators of various types, which would require a constant change in templates. This would require a considerable store of templates, leading to mistakes and making rapid testing impossible because of the time required to select the necessary template.

SUMMARY OF THE INVENTION

It is accordingly a primary object of this invention to provide a testing method and apparatus useful in shops and garages, and which may be readily used with any type of generator-regulator unit in a minimum of time and, if desired, with a degree of, or full, automation.

The above and other objects are accomplished according to the method of the present invention by fully exciting the generator and setting at least two rotary speed values consecutively while the generator is fully excited. The power output of the unit corresponding to each of the set rotary speeds is then determined while separately holding constant or stabilizing the output parameter of the unit to be tested, i.e., the voltage or the current at a value below that of the operating value of the regulator. The separately controlled output parameter of the unit is subsequently transmitted and determined while the other output parameter is held constant or stabilized. Finally, the zero-watt rotary speed of the generator is determined while the generator is fully excited.

Since the power output of the generator is always a function of the rotary speed of the generator, the determination of at least three characteristic values of parameters, i.e., the two parameters of the power output of the unit and the zero-watt rotary speed, suffices to ascertain the functional efficiency of the generator part of the unit. If the generator and/or the diode arrangement coupled to its output is faulty, at least one of the characteristic values determined by this testing method will deviate from a tolerance limit and this may be readily determined by an operator by comparing the measured value with a table of desired or normal values. It is also possible to store the normal values and to compare them electronically with the measured values to indicate any deviations going beyond limits of tolerance.

It is particularly useful to determine the two characteristic output parameters of the fully excited generator by stabilizing the output voltage of the unit below the operating voltage of the regulator, and to determine the output currents corresponding to two different set rotary speeds. The two rotary speeds are so selected, for instance, that the higher speed is within the range of the nominal power of the generator and the lower speed is within the range of the increasing power. In this case, the regulator is a voltage regulator and will not be functional while the power values are determined since the output voltage is kept constant below the operating voltage of the regulator. Thus, the output values of the unit will be essentially the output values of the generator component thereof. Afterwards, the separate control of the output voltage of the unit is unblocked so that the operating voltage of the regulator is reached while the output current of the unit is separately kept constant.

The load for the generator may be the last set load for determining a point of the power diagram or another load may be set.

It will be useful to set a rotary speed corresponding to the nominal power of the generator and to stabilize the current at about 50% of the nominal current of the generator. This will assure that the regulator will fully control the parameters to be regulated even at the upper limit of the control range. By indicating the output voltage of the regulator and comparing the same with a nominal or desired value thereof, the efficiency of the regulator may be tested. In this case, too, the comparison may be made by an operator or electronically.

The circuit arrangement for the above-described in-shop testing comprises essentially a drive coupled to the generator for driving the same, a load connected to the output of the unit and selectively controlled by one of the output parameters of the unit for stabilizing the controlled output parameter, and a device for determining the zero-watt rotary speed.

BRIEF DESCRIPTION OF THE DRAWING

The above and other objects, advantages and features of the present invention will become more apparent from the following detailed description of a preferred embodiment thereof, taken in conjunction with the accompanying drawing wherein.

DESCRIPTION OF THE PREFERRED EMBODIMENT

Figure 1:
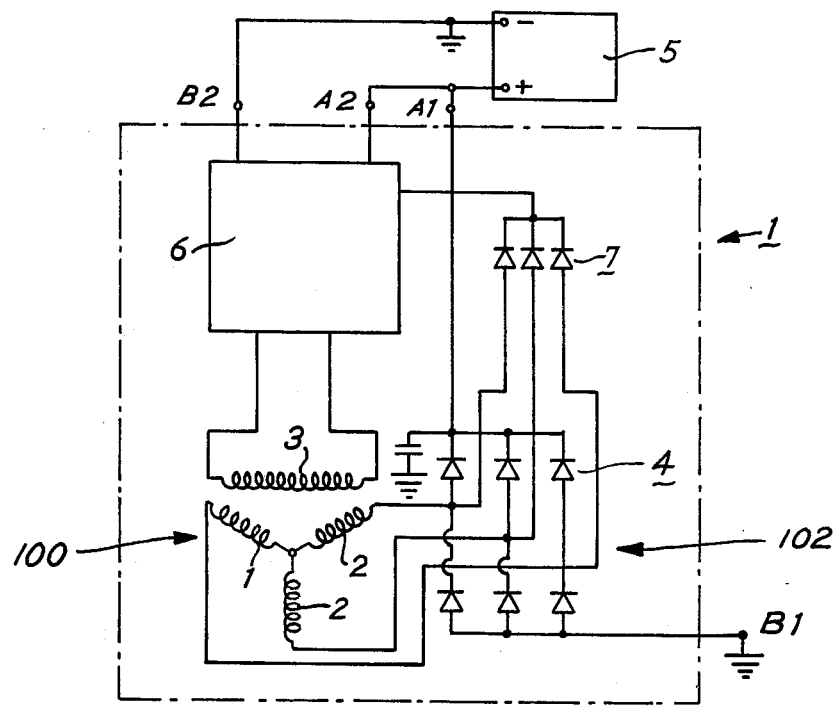
FIG. 1 schematically illustrates a generator-regulator unit which may be tested according to this invention.

Referring now to the drawing and first to FIG. 1, there is shown a generator-regulator unit 1 comprising an alternating current generator generally designated 100, including stator coil 2 and field coil 3, as well as diode bridge circuit 4 for rectifying the A.C. voltage output of the generator. This generator-and-diode bridge circuit combination is termed an "alternator" herein and generally designated 102. The alternator 102 has output terminals A1 and B1, negative terminal B1 being grounded while positive terminal A1 is connected to battery 5 of a motor vehicle (not shown).

Unit 1 also comprises regulator 6, indicated in the drawing merely by a block, to maintain a constant output voltage at the output terminals A1, B1 of the alternator 102. In the embodiment of FIG. 1, the regulator 6 is connected to the field coil 3 of the generator 100 and its output terminals A2, B2 are connected to the output terminals A1 and B1, respectively, of the alternator 102.

The self-excitation of the generator 100 is effected by diode arrangement 7.

While FIG. 1 illustrates by way of example one possible embodiment of a generator-regulator unit whose functional efficiency may be tested with the method and apparatus of the present invention, the latter is not limited to the testing of this type of unit.

Figure 2:
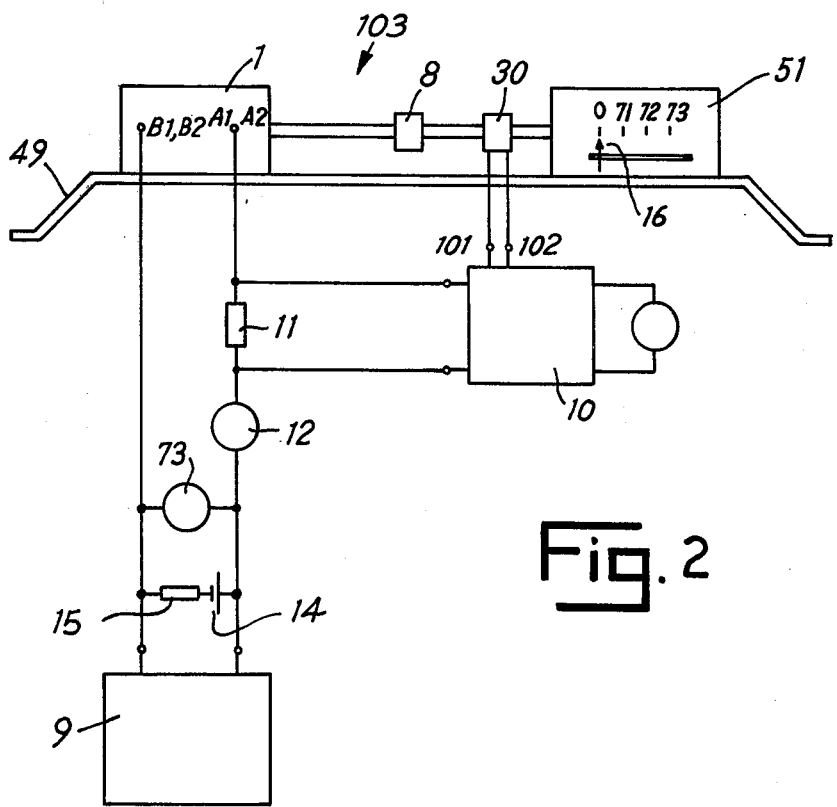
FIG. 2 is a schematic illustration of an apparatus for effectuating the testing method of the invention.
Figure 4:
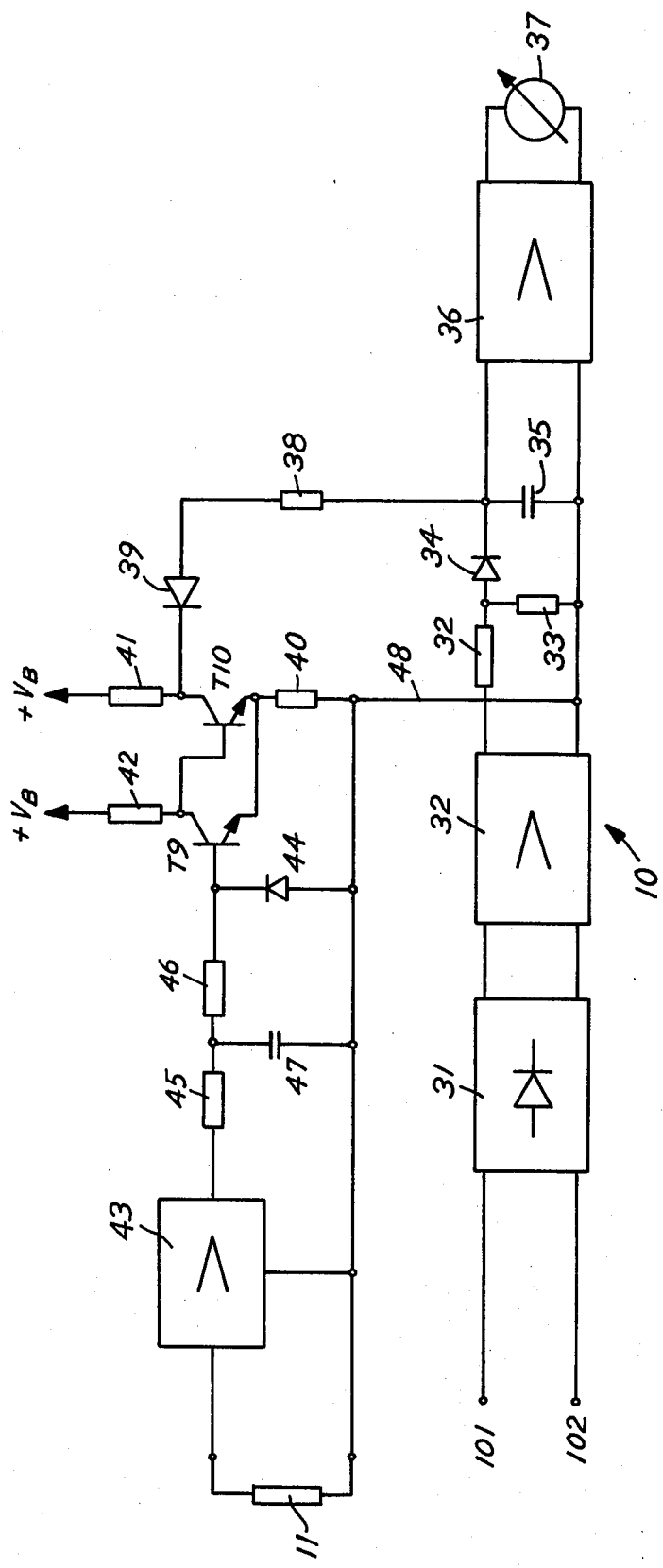
FIG. 4 schematically illustrates a circuit diagram for determining the zero-watt rotary speed.

A preferred embodiment of the testing apparatus, generally designated 103, is shown in FIG. 2 in conjunction with the generator-regulator unit 1 of FIG. 1, the unit 1 being mounted on carriage 49 and being coupled to drive unit 51 arranged on the carriage 49. The coupling is schematically shown at 8 and may consist of a V-belt drive. Instrument 9 for the selective maintenance of one of the output variables, voltage or current, at a constant level is connected to output terminals A1, A2 and B1, B2 of the generator-regulator unit 1. Sensor 11 for device 10 for determining the zero-watt rotary speed and ammeter 12 are arranged in the positive connection between unit 1 and instrument 9, device 10 being more fully described hereinafter in connection with FIG. 4 showing an example of such a device for purposes of illustration, without limiting the invention to such a specific device.

Voltmeter 13 and battery 14 with series resistance 15 are connected in parallel with the input of stabilizing instrument 9. The battery 14 is not essential and only represents a possible auxiliary means for the self-excitation of the generator 100.

The illustrated drive unit 51 is constituted by a multi-speed motor. This has the advantage that fixed rotary speed values may be assigned to set positions 71, 72, 73, and these values need not be determined separately but may be built into the apparatus 51 as given constants. This is a considerable advantage over known testing apparatus which require adjustable D.C. shunt-wound electric motors or repulsion motors with continuous rotary speed indicator.

In the following description, it is assumed that a generator-regulator unit 1 such as shown in FIG. 1 and arranged for a 12-volt motor car circuit is to be tested. Obviously, the present invention is not limited to such a unit and may be used in connection with alternators of any desired output.

Stabilizing instrument 9, is, for instance, arranged in the manner to be described hereinafter in connection with FIG. 3 to maintain the output voltage of unit 1 at 14 volts. Since the operating voltage of regulator 6 is between about 14.4 and 14.9 volts, no regulating effect is obtained. The output values of the unit 1 correspond substantially to the output values of the alternator 102. Since the voltage is stabilized or held constant, the determination of the output capacity of the alternator 102 is limited to the determination of the output current in dependence on the rotary speed of the generator 100.

Figure 5:
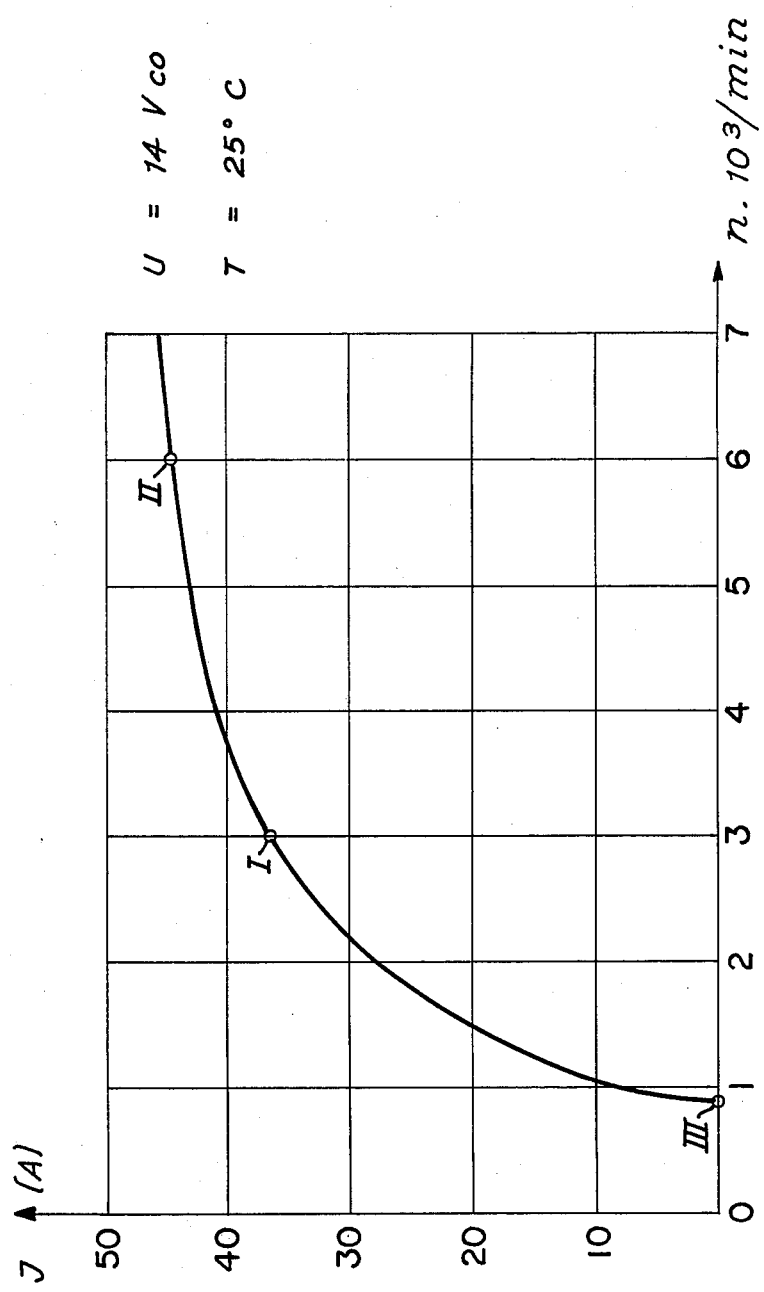
FIG. 5 is a performance diagram.

FIG. 5 shows a performance diagram for a certain alternator 102. By moving switch 16 to position 71, a motor 51 is actuated and will run at a speed $n$ corresponding to the selected setting. According to the diagram, the speed is 3000 rpm (point I). Ammeter 12 will measure the corresponding output current of the alternator 102 at this speed. Thereupon switch 16 is moved to position 72 whose rotary speed corresponds to the nominal speed of the generator 100. This is 6000 rpm (point II) in the diagram of FIG. 5. The output current at this speed is then measured.

The measured values of the output current of the alternator 102 at the set speeds are compared with the desired values. However, this is not sufficient to determine the operating efficiency of the alternator 102. This can be determined only by using a third characteristic measuring point, indicated at III in FIG. 5, i.e., the zero-watt speed. This is accomplished with device 10 to be described, merely by way of example, in connection with FIG. 4.

Obviously, further output current values of the alternator 102 could be measured but the determination of the above-described three characteristic values has been found to be sufficient. The zero-watt speed, i.e., the number of revolutions per minute, at which the generator current begins to flow or is reduced to zero, may be detected either as the generator 100 speeds up to reach point I, or when motor 51 is shut off, i.e., as the speed decreases.

If all three measured values (current and speed) correspond to the desired values, the test shows the alternator 102 at its highest operating efficiency. If at least one of the measured values deviates from the desired values, the alternator 102 is faulty.

Experiments have shown that the type of fault of the alternator 102 may be determined by the characteristic point or points which deviates or deviate from the desired value(s). For instance, if measuring point I shows a value different from that of the desired value, it can be assumed that a diode in the bridge circuit 4 is interrupted. If deviations are determined at points I and II, there is a short in the diode circuit 4. If the deviation at point III is of the type that the alternator current starts only at higher speed, there is almost certainly a fault in the exciter circuit. If there is no current output from the generator 100 up to the nominal speed thereof, it is possible that the direct connection of the exciter voltage to the field coil 3 of the alternator 102 is interrupted in the regulator 6, in which case the alternator test may be continued merely by shorting the regulator 6 from the outside.

To test the regulator 6, stabilizing instrument 9 is used to maintain the current constant and switch 16 is moved to position 73 to run motor 51 at a speed which preferably is within the range of the nominal capacity of the generator 100. Since the output voltage of the alternator 102 is no longer held constant, it can reach the operating voltage of the regulator 6 so that the latter may operate as a control. The output voltage controlled by regulator 6 of the unit 1 is indicated by voltmeter 13 and may be compared with the desired value at which the tested regulator 6 is designed to hold the output voltage. If the deviation surpasses a given tolerance limit, the regulator 6 is faulty and must be replaced.

Figure 3:
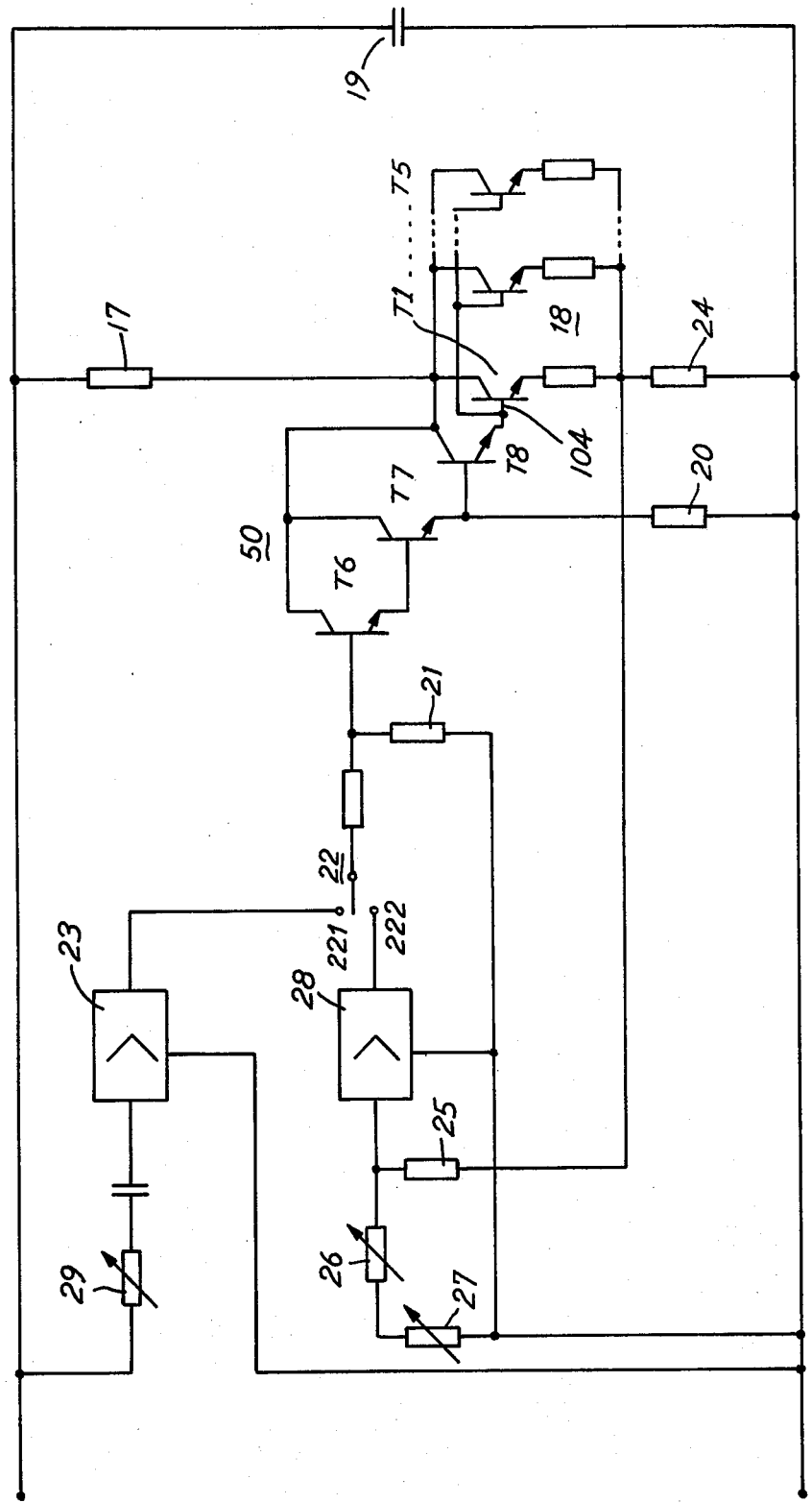
FIG. 3 shows a circuit diagram for selectively maintaining the output voltage and the output current of a generator-regulator unit to be tested constant.

FIG. 3 shows, by way of example, a circuit diagram of a device for selectively stabilizing the alternator current or the alternator voltage. The illustrated circuit of stabilizing instrument 9 includes a series resistance arrangement of resistances 17 and 18 and condenser 19 connected in parallel to the series resistance arrangement. Resistance 18 includes a capacitative transistor T1 representing a load controlled in response to changes in the input voltage or the current flowing through the series resistance arrangement. The load is controlled by an input signal from amplifier 50 connected to the input 104 of the resistance arrangement, the signal being selectively proportional to voltage or current variations, depending on the position of switch 22. The amplifier 50 includes transistors T6, T7 and T8 in a Darlington circuit and working resistance 20. Any voltage variations are received by control amplifier 23 and the amplified output signal of the amplifier 23 is transmitted to amplifier 50 when switch 22 connects amplifiers 23 and 50. The control signal for stabilizing the current is received at resistance 24 connected in series with load resistances 17 and 18. A voltage divider consisting of resistors 25, 26, 27 is connected in parallel with resistance 24, the output voltage from adjustable resistors 26, 27 being transmitted to control amplifier 28 whose amplified output signal is selectively transmitted to amplifier 50 when switch 22 connects amplifiers 28 and 50. The magnitude of the voltage or current to be controlled is adjustable by adjusting variable resistors 29 or 26, 27.

When measuring points I and II (FIG. 5) are to be determined, switch 22 is in switching position 221 to connect amplifiers 23 and 50 and to vary the load in the series resistance arrangement in response to any voltage variations occurring so as to maintain the voltage constant.

When the regulator 6 is tested, i.e., when it is desired to permit the voltage to vary but to hold the current constant, switch 22 is thrown into position 222. Resistor 21, which is connected between the input of amplifier 50 (base of transistor T6) and the common reference potential, prevents the input from being without a reference potential while the switch is moved from position 221 to position 222. The switch is preferably constituted by the switch contacts of a relay.

FIG. 4 illustrates one embodiment of device 10 for determining the zero-watt rotary speed of the generator 100, i.e., for finding measuring point III of FIG. 5. However, referring first to FIG. 2, a conventional tachogenerator 30 is shown fixedly mounted on the shaft of motor 51. The A.C. output voltage of the tachogenerator 30, which is proportional to the motor speed, is transmitted to terminals 101, 102 of device 10, shown as a block in FIG. 2. Obviously, any suitable motor signal transmitter indicating the motor speed may be used instead of the tachometer 30, and such a transmitter may be associated either with the motor or with the tested generator as long as it produces an A.C. or D.C. output signal proportional to the rotary speed.

Referring now to FIG. 4, device 10 includes a rectifier circuit 31 converting the A.C. signal proportional to the rotary speed, which is transmitted by tachogenerator 30, into an analog D.C. signal. This signal is amplified in amplifier 32 receiving the output of rectifier 31. The amplified output signal of amplifier 32 is transmitted to resistors 32, 33 which essentially constitute a voltage divider. The anode of diode 34 is connected to the point of connection between resistors 32 and 33. A condenser 35 is connected between the cathode of the diode 34 and the reference potential. A directly indicating amplifier 36 having a high input resistance is connected to condenser 35.

Resistor 38 is connected to the cathode of diode 34 and the anode of diode 39. The cathode of diode 39 is connected to the collector of transistor T10 which forms a Schmitt trigger circuit with transistor T9. Resistors 41, 42 constitute the working resistances of the transistor circuit T9, T10 while resistor 40 is a coupling resistance thereof. The D.C. signal from sensor 11 (see FIG. 2), which is a resistor in this preferred embodiment, is amplified by amplifier 43 and controls the Schmitt trigger circuit, working as a switch. The T-element consisting of resistors 45, 46 and condenser 47, which is arranged between amplifier 43 and the Schmitt trigger circuit serves essentially to smooth the amplifier D.C. signal and to eliminate static. Protective diode 44 operates when a voltage of wrong polarity appears at resistor 11. Through connection 48, the just described circuit portion has the same reference potential as the circuit portion which amplifies the output signal of the tachogenerator 30.

The circuit of FIG. 4 operates in the following manner:

As appears from FIG. 5, a voltage will be registered on resistor 11 whenever the rotary speed exceeds that of the zero-watt speed. This voltage will make transistor T10 conductive and the collector thereof will be practically at the reference potential. This causes condenser 35 to have the reference potential, except for the voltage drop caused by resistor 38 connected between transistor T10 and condenser 35. The condenser 35 discharges via resistor 38, diode 39 and resistor 40.

However, when the rotary speed is reduced, i.e., after drive motor 51 is shut off, and reaches the zero-watt rotary speed, which causes the voltage at resistor 11 to disappear, transistor T10 blocks and the cathode of diode 39 reaches the potential $+V_B$. Thus, the diode 39 turns "off" so that the condenser 35 is charged according to the analog signal present at that moment. Since smaller voltage values correspond to the subsequent rotary speeds, diode 34 blocks and the condenser 35 cannot discharge, thereby retaining the charge corresponding to the zero-watt rotary speed. Thus, condenser 35 constitutes a maximum charge storage device. This charge is indicated by instrument 37, for instance a rotating coil instrument, calibrated according to rotary speeds, which receives an amplified signal from amplifier 36.

The present invention is not limited to the abovedescribed specific circuit arrangement for determining the zero-watt rotary speed but may use any suitable signal storage device known in the analog or digital computer art. Further, the rotary speed determined by such storage devices may be indicated in any suitable manner, including a continuous indication of the varying rotary speeds, if desired. It is also possible to determine the zero-watt rotary speed during an increase in the speed, depending solely on the frequency and condition of response of the rotary speed transmitter.

The testing system of this invention is also not limited to testing generator-regulator units for a 12-volt motor car electrical system. It may be readily changed for testing such units for a 6-volt or 24-volt system, for instance, simply by appropriately adjusting the load resistance 17, gain of amplifier 23 and voltage of batteries 14, 15. Finally, the invention is not limited to testing alternators but may be used to test generator-regulator units with a D.C. generator.

The true scope and spirit of the present invention is limited only by the following claims.

What is claimed is:

1. A method for testing an apparatus for producing an output voltage and an output current, said apparatus having predetermined performance characteristics and rotatable coil means, comprising the steps of:
    limiting said output voltage substantially to a predetermined voltage threshold;
    variably rotating said rotatable coil means;
    sensing said output current to determine the zero-watt rotary speed of said apparatus, said apparatus initiating production of said output current whenever said output voltage substantially equals said predetermined voltage threshold;

rotating said rotatable coil means at a first and second rotary speed above said zero-watt rotary speed;

measuring said output current at said first and second rotary speeds; and comparing said zero-watt rotary speed, said first rotary speed output current and said second rotary speed output current with said predetermind performance characteristics.

2. A method as claimed in claim 1, wherein said apparatus includes regulator means for regulating said output voltage to produce a regulated output voltage, said regulator means defining a regulating threshold exceeding said predetermined voltage threshold, further comprising the steps of:

discontinuing limitation of said output voltage;

rotating said rotatable coil means at a third rotary speed, said output voltage exceeding said regulating threshold at said third rotary speed;

maintaining said output current substantially at a predetermined current threshold; and measuring said regulated output voltage.

3. An apparatus for testing a unit producing an output voltage and an output current, said unit having rotatable coil means, comprising, in combination:

drive means for variably rotating said rotatable coil means, said drive means having at least a first and second rotary speed;

output means for selectively limiting said output voltage substantially to a predetermined voltage level, said unit producing said output current whenever said output voltage substantially equals said predetermined voltage level;

means for measuring said output current at said first and second rotary speeds; and means for sensing initiation of said output current said sensing means, drive means and output means cooperatively defining zero-watt means for determining the zero-watt rotary speed of said unit.

4. An apparatus as claimed in claim 3 wherein said drive means includes a multi-speed motor.

5. An apparatus as claimed in claim 4 wherein said drive means further includes means for coupling said multi-speed motor and said rotatable coil means.

6. An apparatus as claimed in claim 3 wherein said zero-watt means includes voltage storage means, tachometer means for producing a charging voltage in response to rotation of said rotatable coil means and means for interconnecting said voltage storage means and said tachometer means, whereby said voltage storage means is charged during rotation of said rotatable coil means.

7. An apparatus as claimed in claim 6 wherein said zero-watt means further includes first controllably conductive means responsive to said sensing means for maintaining a stored voltage on said voltage storage means, said stored voltage being proportional to said zero-watt speed.

8. An apparatus as claimed in claim 7 further comprising display means responsive to said stored voltage for displaying said zero-watt rotary speed.

9. An apparatus as claimed in claim 7 wherein said voltage storage means is a capacitor.

10. An apparatus as claimed in claim 3 wherein said output means includes second controllably conductive means for varying the resistance across said unit.

11. An apparatus as claimed in claim 10 wherein said output means includes first control means for sensing variations in said output voltage, said second controllably conductive means being responsive to said first control means.

12. An apparatus as claimed in claim 11 wherein said output means further includes second control means for sensing variations in said output current and means for selectively interconnecting said second controllably conductive means to said first control means and said second control means, said second controllably conductive means and said second control means cooperatively defining means for maintaining said output current substantially at a predetermined current threshold.

* * * * *